US011563303B2

(12) United States Patent
Moeneclaey et al.

(10) Patent No.: US 11,563,303 B2
(45) Date of Patent: Jan. 24, 2023

(54) OPTICAL PULSE EMITTER

(71) Applicants: STMicroelectronics (Grenoble 2) SAS, Grenoble (FR); STMicroelectronics (Research & Development) Limited, Marlow (GB)

(72) Inventors: Nicolas Moeneclaey, Vourey (FR); Shatabda Saha, Edinburgh (GB)

(73) Assignees: STMicroelectronics (Grenoble 2) SAS, Grenoble (FR); STMicroelectronics (Research & Development) Limited, Marlow (GB)

(*) Notice: Subject to any disclaimer, the term of this patent is extended or adjusted under 35 U.S.C. 154(b) by 721 days.

(21) Appl. No.: 16/569,956

(22) Filed: Sep. 13, 2019

(65) Prior Publication Data
US 2020/0006915 A1 Jan. 2, 2020

Related U.S. Application Data

(62) Division of application No. 15/052,458, filed on Feb. 24, 2016, now Pat. No. 10,454,246.

(30) Foreign Application Priority Data
Sep. 7, 2015 (FR) ..................... 1558295

(51) Int. Cl.
*H01S 3/10* (2006.01)
*H01S 5/042* (2006.01)
*H01S 5/183* (2006.01)
*H01S 5/026* (2006.01)
*G01S 7/484* (2006.01)
(Continued)

(52) U.S. Cl.
CPC ............ *H01S 5/0428* (2013.01); *H01S 5/026* (2013.01); *H01S 5/0261* (2013.01); *H01S 5/042* (2013.01); *H01S 5/0427* (2013.01); *H01S 5/183* (2013.01); *G01S 7/484* (2013.01); *G01S 7/4863* (2013.01); *G01S 7/4865* (2013.01); *G01S 17/10* (2013.01);
(Continued)

(58) Field of Classification Search
CPC ...... H01S 5/0428; H01S 5/183; H01S 5/0427; H01S 5/026; H01S 5/0261
See application file for complete search history.

(56) References Cited

U.S. PATENT DOCUMENTS 10,454,246 B2\* 10/2019 Moeneclaey ............ H01S 5/026
2010/0194274 A1\* 8/2010 Hoogzaad .......... H05B 45/3725
315/71
(Continued)

FOREIGN PATENT DOCUMENTS

WO 2010117502 A2 10/2010

OTHER PUBLICATIONS

INPI Search Report and Written Opinion for FR 1558295 dated May 11, 2016 (7 pages).

*Primary Examiner* — Kinam Park
(74) *Attorney, Agent, or Firm* — Crowe & Dunlevy

(57) ABSTRACT

Disclosed herein is a method of optical pulse emission including three phases. During a first phase, a capacitor is charged from a supply voltage node. During a second phase, a voltage stored on the capacitor is boosted, and then the capacitor is at least partially discharged through a light emitting device. During a third phase, the capacitor is further discharged by bypassing the light emitting device. The third phase may begin prior to an end of the second phase.

21 Claims, 3 Drawing Sheets

(51) Int. Cl.
  *G01S 7/4863*    (2020.01)
  *G01S 17/10*     (2020.01)
  *G01S 7/4865*    (2020.01)
  *H05B 45/10*     (2020.01)
  *G01S 17/894*    (2020.01)
  *H05B 45/32*     (2020.01)
  *H05B 45/397*    (2020.01)

(52) U.S. Cl.
  CPC ............ *G01S 17/894* (2020.01); *H05B 45/10* (2020.01); *H05B 45/32* (2020.01); *H05B 45/397* (2020.01)

(56) References Cited

U.S. PATENT DOCUMENTS

| | | | |
|---|---|---|---|
| 2010/0243897 A1* | 9/2010 | Madhani | G01S 7/4814 250/338.4 |
| 2011/0043790 A1* | 2/2011 | Komamaki | G01M 11/3145 356/73.1 |
| 2013/0069547 A1* | 3/2013 | van de Ven | H05B 45/44 315/188 |
| 2013/0200802 A1* | 8/2013 | Sakuragi | H05B 45/48 315/122 |
| 2013/0242283 A1 | 9/2013 | Bailey et al. | |
| 2014/0049174 A1* | 2/2014 | Radermacher | H05B 45/48 315/200 R |
| 2014/0062317 A1* | 3/2014 | Lee | H05B 45/48 315/185 R |
| 2014/0312233 A1 | 10/2014 | Mark et al. | |
| 2015/0366014 A1* | 12/2015 | Itoh | H02M 3/1582 315/200 R |
| 2016/0165678 A1* | 6/2016 | Sudhaus | H05B 45/48 315/161 |
| 2018/0069483 A1* | 3/2018 | Akiyama | H02M 7/06 |

* cited by examiner

OPTICAL PULSE EMITTER

RELATED APPLICATION

This application is a division of U.S. patent application Ser. No. 15/052,458, filed on Feb. 24, 2016, which claimed the priority benefit of French Application for Patent No. 1558295, filed on Sep. 7, 2015, the contents of which are hereby incorporated by reference in their entireties to the maximum extent allowable by law.

TECHNICAL FIELD

The present disclosure relates to the field of optical pulse emitters, and in particular to a method and circuit for emitting an optical pulse.

BACKGROUND

For certain applications, such as in ranging devices, it is desirable to provide an optical pulse emitter capable of emitting optical pulses of high intensity and short duration. For example, it has been proposed to use a SPAD (Single Photon Avalanche Detector) array to detect the distance to an object in an image scene. This involves transmitting an optical pulse of relatively high intensity and short duration into the image scene, and using the SPAD array to detect a return pulse reflecting off an object present in the image scene. The time of flight of the optical pulse can then be estimated, allowing the distance to the object to be estimated.

A VCSEL (Vertical Cavity Surface-Emitting Laser) is a light emitting device capable of emitting light with an intensity that depends on a level of current driven through it. However, there is a technical problem in providing a circuit capable of driving a VCSEL or similar light emitting device to generate an optical pulse of a relatively high intensity and short duration.

SUMMARY

It is an aim of embodiments of the present disclosure to at least partially address one or more problems in the prior art.

According to one aspect, there is provided an optical pulse emitter includes: a light emitting device having a first node coupled to an intermediate node via a first switch, the intermediate node being coupled to a supply voltage node via a second switch; a capacitor having a first node coupled to the intermediate node; and a control circuit adapted, during a first phase, to control the second switch to couple the capacitor to the supply voltage node, and, during a second phase, to deactivate the second switch and to activate the first switch to at least partially discharge the capacitor through the light emitting device.

According to one embodiment, the optical pulse emitter also includes a variable resistor coupled between the light emitting device and a low voltage rail.

According to one embodiment, the optical pulse emitter also includes a third switch coupled between the first node of the light emitting device and a second node of the light emitting device, and the control circuit is further adapted, during a third phase, to activate the third switch.

According to one embodiment, a second node of the capacitor is coupled to a low voltage rail.

According to one embodiment, a second node of the capacitor is coupled to a further node, the further node being coupled to a low voltage rail via a fourth switch and to the supply voltage node via a fifth switch, and the control circuit is adapted to activate the fourth switch during the first phase and to activate the fifth switch during the second phase.

According to one embodiment, the optical pulse emitter also includes: a voltage regulating circuit having an output coupled to the supply voltage node, the voltage regulating circuit being adapted to regulate the voltage at the supply voltage node based on a feedback voltage representing the voltage level across the light emitting device during the second phase.

According to one embodiment, the voltage regulating circuit includes a differential amplifier having a first input coupled to a reference voltage node and a second input coupled to receive the feedback voltage via a potential divider, the optical pulse emitter also including: a further capacitor having one node coupled to the intermediate node via a sixth switch and to the potential divider, the control circuit being adapted to activate the sixth switch during the second phase to couple the further capacitor to the intermediate node.

According to one embodiment, the light emitting device is a VCSEL (Vertical Cavity Surface-Emitting Laser).

According to a further aspect, there is provided a ranging device including: the above optical pulse emitter adapted to emit an optical pulse into an image scene; and a SPAD (single photon avalanche detector) array adapted to detect a return optical pulse from the image scene.

According to a further aspect, there is provided a method of optical pulse emission including: during a first phase, coupling a capacitor to a supply voltage node by activating a second switch coupled between an intermediate node and the supply voltage node, the intermediate node being coupled to a first node of the capacitor; and during a second phase, deactivating the second switch, and activating a first switch coupled between the intermediate node and a first node of a light emitting device to at least partially discharge the capacitor through the light emitting device.

According to another aspect, there is provided method of optical pulse emission including: during a first phase, closing a first switch to couple a first plate of a capacitor to a supply voltage node and closing a second switch to couple a second plate of the capacitor to ground; at an end of the first phase, opening the first and second switches; during a second phase, closing a third switch to couple the first plate of the capacitor to an anode of a light emitting device that has a cathode coupled to ground; and during a third phase, closing a fourth switch to couple the anode of the light emitting device to the cathode of the light emitting device.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 3 schematically illustrates an optical pulse emitter according to an embodiment of;

DETAILED DESCRIPTION

Throughout the present description, the term "connected" is used to designate a direct electrical connection between two elements, whereas the term "coupled" is used to designate an electrical connection between two elements that may be direct, or may be via one or more other components such as resistors, capacitors, transistors or switches. Furthermore, as used herein, the term "around" is used to designate a range of ±10% of the value in question.

While embodiments are described in which an optical pulse emitter comprises a VCSEL, it will be apparent to those skilled in the art that the VCSEL in the various embodiments could be replaced by other types of light emitting device capable of emitting an optical pulse based on a current passed through them, such as LED (light emitting diode) devices and drivers.

Furthermore, while in the present description laser pulse emitters are described for use in ranging devices, it will be apparent to those skilled in the art that the circuits and methods described herein could have other applications in which a relatively short and intense optical pulse is to be generated and emitted.

Figure 1:
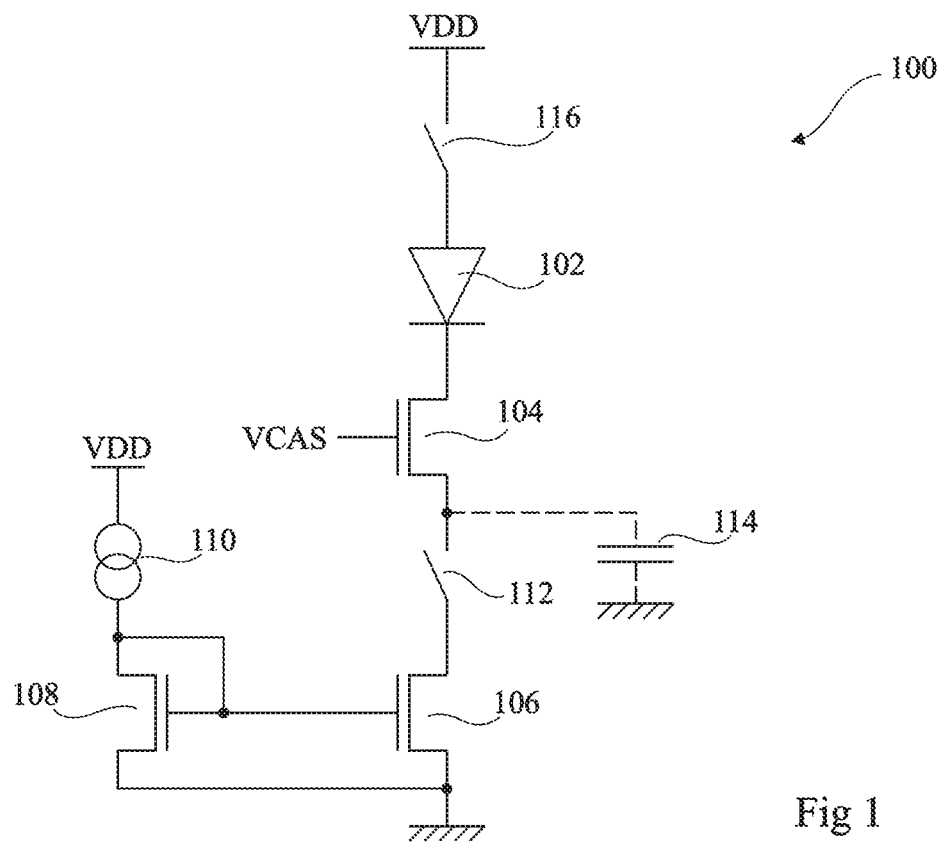
FIG. 1 schematically illustrates an optical pulse emitter according to a solution.

FIG. 1 schematically illustrates an optical pulse emitter 100 according to a solution. A VCSEL (Vertical Cavity Surface-Emitting Laser) 102 generates light when current is passed through it. The VCSEL 102 has one of its nodes coupled to a supply voltage rail VDD and its other node coupled to ground via a series connection of MOS transistors 104 and 106 coupled in a cascode configuration. Transistor 104 receives at its gate a voltage VCAS. The transistor 106 forms part of a current mirror having a reference branch comprising a further transistor 108 coupled in series with a current source 110. The gates of the transistors 106 and 108 are coupled together, and to the drain of transistor 108.

A switch 112 is coupled between the transistors 104 and 106, and permits the control of the current passing through the VCSEL 102. A further switch 116 is for example provided between the VCSEL 102 and the supply voltage rail VDD and provides a safety measure by allowing the current through the VCSEL 102 to be stopped.

A drawback with the circuit of FIG. 1 is that, as represented by a capacitor 114, a node between the transistor 104 and the switch 112 will have a relatively high parasitic capacitance. When the switches 112 and 116 are initially made to be conducting, charge stored by this capacitance will discharge through the current source 106 of the current mirror, thereby slowing the rising edge of the current through the VCSEL 102. In view of this slow rising edge, it is difficult to achieve a short and high current pulse through the VCSEL 102. Furthermore, while larger current sources could be used to increase the current through the VCSEL, this would also have the effect of increasing the parasitic capacitance 114, and thus further increasing the rise time of the current.

Figure 2:
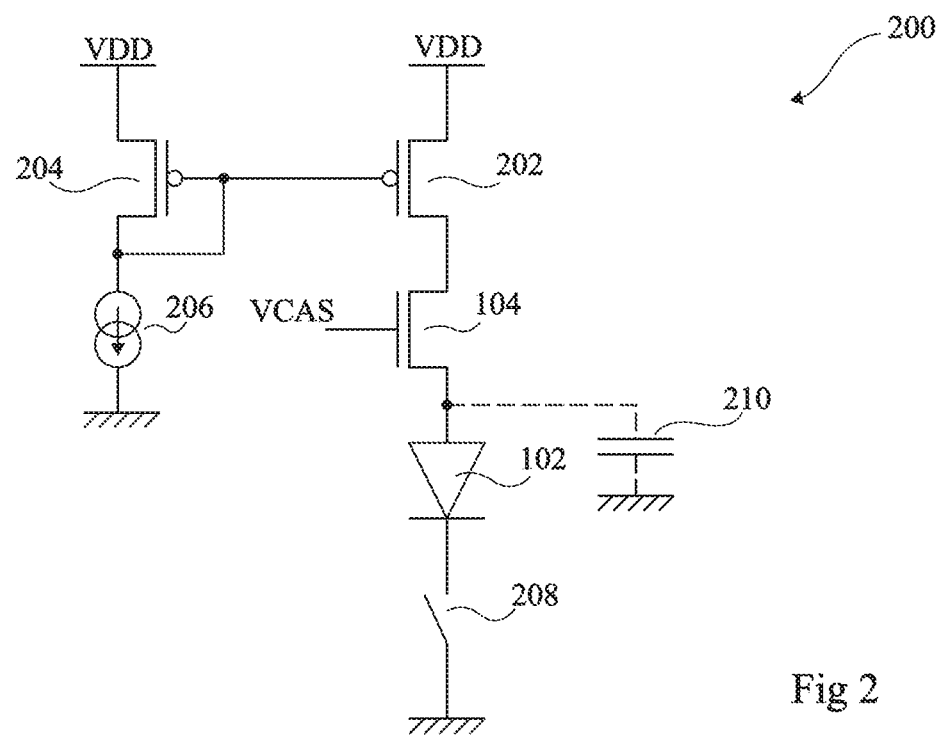
FIG. 2 schematically illustrates an optical pulse emitter according to a further solution.

FIG. 2 schematically illustrates an optical pulse emitter 200. In the circuit of FIG. 2, the VCSEL 102 has its anode coupled to the supply voltage rail VDD via a cascode configuration of MOS transistors 104 and 202. The transistor 104 for example receives a voltage VCAS at his gate. The transistor 202 is a PMOS transistor forming part of a current mirror that also comprises a further PMOS transistor 204 coupled between the supply voltage rail VDD and a current source 206. The cathode of the VCSEL 102 is coupled to ground via a switch 208. A parasitic capacitance 210 will be associated with the node between the transistor 104 and the VCSEL 102, but in the circuit of FIG. 2, the charge stored by this capacitance will discharge through the VCSEL 102 when the switch 208 is rendered conductive, and will thus not limit the rise time of the rising edge of the current. However, a drawback of the circuit of FIG. 2 is that the level of current through the VCSEL, and thus the optical power provided by the VCSEL, is not accurately controlled.

Figure 3:
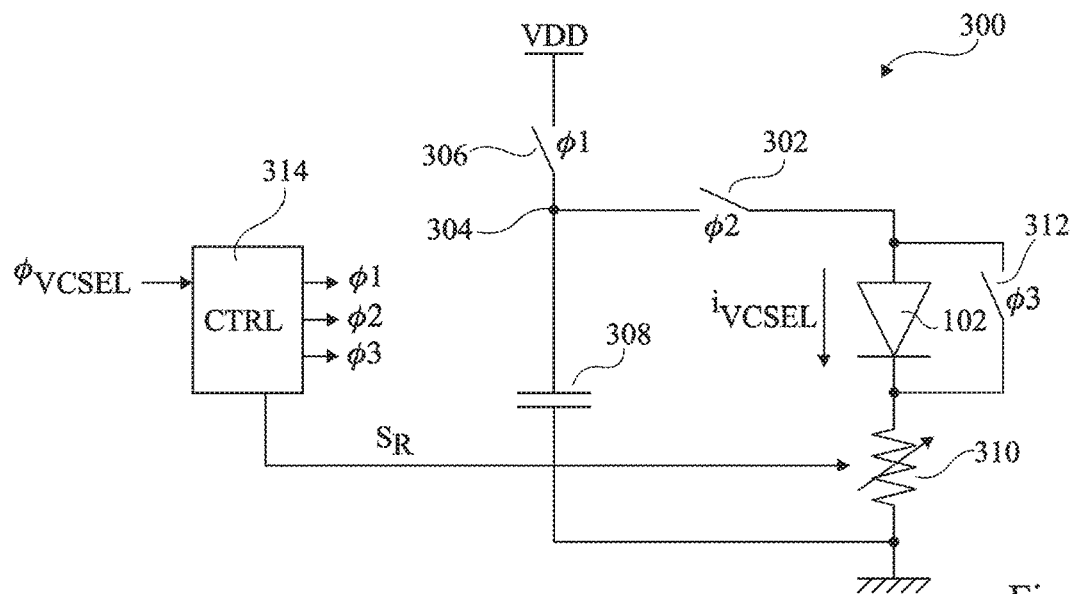

FIG. 3 schematically illustrates an optical pulse emitter 300 according to an example embodiment.

In the embodiment of FIG. 3, a VCSEL 102 has its anode coupled via a switch 302 to an intermediate node 304. The node 304 is in turn coupled to a supply voltage rail VDD via a further switch 306. The intermediate node 304 is also coupled to one node of a capacitor 308, the other node of which is for example coupled to a ground rail. The cathode of the VCSEL 102 is for example coupled to the ground rail via variable resistor 310. However, in alternative embodiments, the variable resistor 310 could be replaced by a direct connection between the VCSEL 102 and the ground rail, or replaced by a resistor of fixed resistance. A switch 312 is also for example coupled across the VCSEL 102, for example between its anode and cathode.

The switch 306 is for example controlled by a first phase signal φ1, the switch 302 is for example controlled by a second phase signal φ2, and the switch 312 is for example controlled by a third phase signal φ3. The phase signals φ1, φ2 and φ3 are for example generated by a control circuit 314 (CTRL), based on a signal $\phi_{VCSEL}$ indicating the timing of one or more optical pulses to be generated. The control circuit 314 also for example generates a control signal $S_R$ for controlling the resistance of the variable resistance 310.

Operation of the emitter 300 of FIG. 3 will now be described in more detail with reference to FIG. 4.

Figure 4:
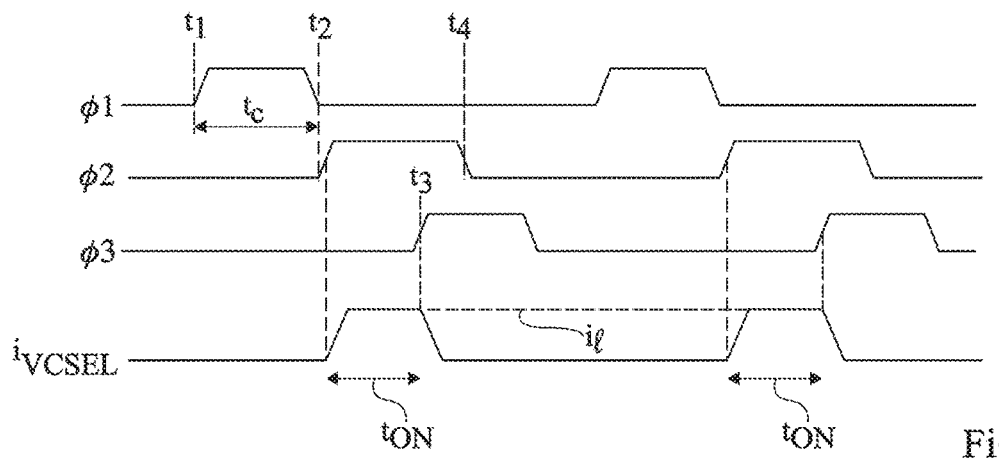
FIG. 4 is a timing diagram illustrating examples of signals in the circuit of FIG. 3 according to example embodiment.

FIG. 4 is a timing diagram illustrating examples of the phase signals φ1, φ2 and φ3, and of the current $i_{VCSEL}$ through the VCSEL 102.

Initially, the signals φ1, φ2 and φ3 are all for example low, and implying that the switches 306, 302 and 312 are all non-conducting. Of course, in alternative embodiments, one or more of these switches could be rendered non-conductive by a high signal.

At a time $t_1$, the signal φ1 is activated, such that the switch 306 is rendered conductive. This couples the capacitor 308 to the supply voltage rail VDD, and thus charges the capacitor 308.

At a time $t_2$, after a charging time $t_c$ equal for example between 400 ps and 5 ns after the time $t_1$, the signal φ1 is brought low, disconnecting the intermediate node 304 from the supply voltage rail VDD. At the same time or shortly thereafter, the signal φ2 is asserted, to render conductive the switch 302. This couples the intermediate node 304 to the VCSEL 102, and causes the charge stored by the capacitor 308 to be discharged through the VCSEL 102. Thus the current $i_{VCSEL}$ through the VCSEL 102 rises rapidly.

At a time $t_3$ the signal φ3 is for example activated in order to render the switch 312 conductive, thereby creating a bypass of the VCSEL 102, and abruptly reducing the current $i_{VCSEL}$ flowing through the VCSEL 102 to a low level. The signal φ2 for example goes low to render non-conductive the switch 302 at a time $t_4$, which is for example after the time $t_3$, such that it is the rising edge of the signal φ3 at the time $t_3$ that controls the pulse duration $t_{ON}$ of the current pulse driven through the device 102.

As illustrated in FIG. 4, the activation sequence of the signals φ1, φ2 and φ3 can be repeated in order to generate a further optical pulse. In some embodiments, the optical pulses may have a period of less than 1 ns. For example, the charge time $t_c$ of the capacitor 308 and the duration $t_{ON}$ of the current pulse may each be as low as 500 ps or less. The signal φ1 can be asserted to start charging the capacitor 308 directly after the signal φ2 goes low.

In some embodiments, the size of the capacitor 308 may be selected in order to limit the duration $t_{ON}$ of the current pulse, in which case the switch 312 could be omitted.

Furthermore, in some cases, the size of the switch 302 may be chosen in order to limit the level $i_1$ of current $i_{VCSEL}$ flowing through the VCSEL 102 during the second phase. Alternatively, a fixed or variable resistor 310 may be used in order to limit the current q. In some embodiments, the supply voltage VDD is between 1.5 and 4 V, the size of the capacitor 308 is in the range 15 to 100 pF, the current $i_1$ is in the range 40 to 100 mA, the pulse duration $t_{ON}$ of the current pulse is in the range 250 ps to 2 ns, and the resistor 310 has a resistance in the range 10 to 100 ohms. The size of the capacitor is for example selected in order to generate sufficient charge based on the optical pulse that is to be generated. For example, if the peak current is of magnitude I, and the pulse width is T, the charge Q for driving the VCSEL will be equal to I×T. The capacitance value C of the capacitor for a given charge Q is given by C=Q/V, where V is the voltage across the capacitor. For example, to obtain a current pulse having a width T of 500 ps and a peak current magnitude I of 50 mA, the charge will be equal to 25 pC. Assuming a voltage V across the VCSEL of 3.5 V, this will lead to a capacitance C of the capacitor equal to 7.14 pF. A capacitance of 15 pF is for example chosen in this case to give a reasonable margin.

Figure 5:
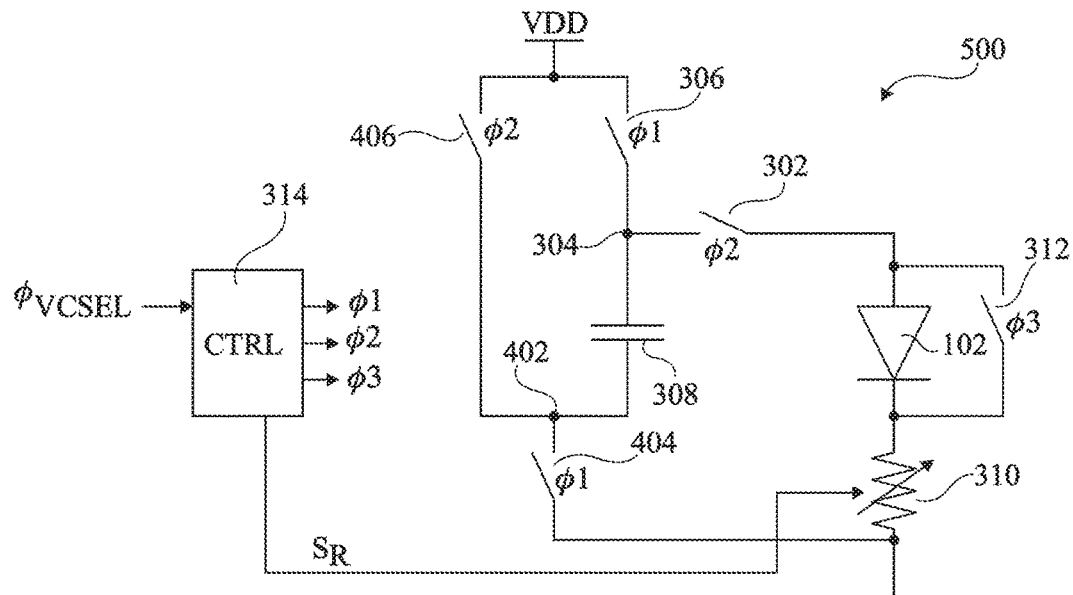
FIG. 5 schematically illustrates an optical pulse emitter according to yet a further example embodiment.

FIG. 5 illustrates a further embodiment of an optical pulse emitter 500, which is similar to the circuit of FIG. 3, and like features have been labeled with like reference numerals and will not be described again in detail. In the emitter 500 of FIG. 5, the capacitor 308 is coupled between the intermediate node 304 and a further node 402, which is in turn coupled to the ground rail via a further switch 404 controlled by the phase signal φ1. The node 402 is coupled to the supply voltage rail VDD via a further switch 406 controlled by the phase signal φ2.

In operation, the timing of the signals φ1, φ2 and φ3 shown in FIG. 4 can for example be used. When the signal φ1 is asserted, the capacitor 308 is charged in the same way as in the circuit 300 of FIG. 3. However, when the signal φ1 is brought low, and the signal φ2 is asserted, the switches 302 and 406 are both rendered conductive, such that the capacitor 308 is coupled between the supply voltage rail VDD and the VCSEL 102. This has the effect of boosting the voltage applied across the VCSEL 102 to around 2VDD, and thereby increasing the current level of the current pulse that can be driven through the VCSEL 102.

Figure 6:
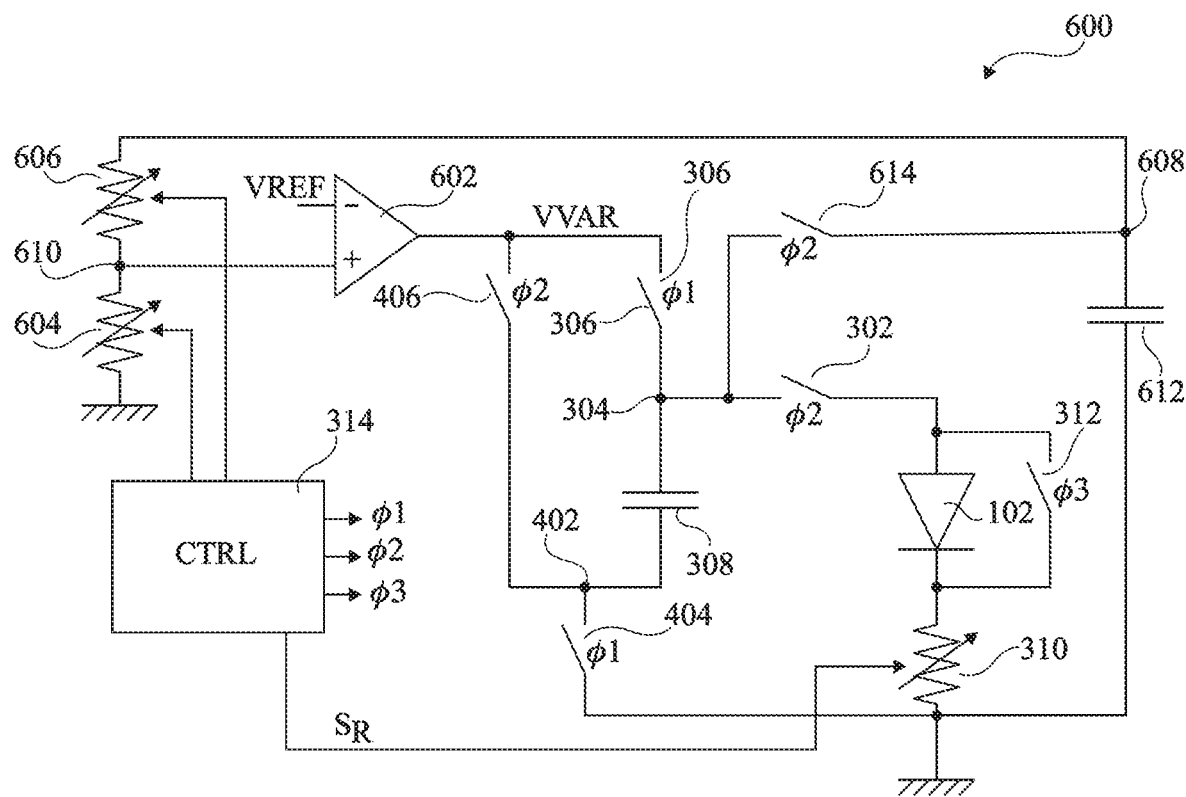
FIG. 6 schematically illustrates an optical pulse emitter according to yet a further example embodiment.

FIG. 6 illustrates a further embodiment of an optical pulse emitter 600, which is similar to the circuit of FIG. 5, and like features have been labeled with like reference numerals and will not be described again in detail. With respect to the circuit of FIG. 5, rather than being coupled directly to the VDD supply rail, in the circuit of FIG. 6, the switches 306 and 406 are coupled to an internal supply voltage node VVAR. The circuit of FIG. 6 additionally comprises a circuit for regulating the voltage level at VVAR. For example, the circuit for regulating the voltage level comprises a differential amplifier 602, which is for example implemented by an operational amplifier or the like, having one of its inputs coupled to a node receiving a reference voltage $V_{REF}$. The input node of the differential amplifier 602 is coupled via a feedback path to the VCSEL 102.

For example, the feedback path comprises a potential divider formed by resistors 604 and 606 coupled in series between a node 608 and the ground voltage rail, and the other input node of the amplifier 602 is coupled to an intermediate node 610 between the resistors 604 and 606. In this way, there may be a factor F between the voltage VREF and the voltage level generated at the output of the differential amplifier 602, such that VVAR=F*VREF. Furthermore, in some embodiments either or both of the resistors 604, 606 is variable, such that the factor F is variable. For example, the control circuit 314 is coupled to either or both of the variable resistors 604, 606 and transmits one or more control signals for controlling the resistance of either of both resistors 604, 606. For example, the control circuit 314 forms part of a processing device of an electronic device within which the optical pulse emitter is installed, and the resistance of the resistors 604, 606 is varied based on a desired brightness of the VCSEL 102. In alternative embodiments, differential amplifier 602 could be coupled directly to the node 608 without using a potential divider.

The node 608 is for example coupled to a capacitor 612, and to the intermediate node 304 via a switch 614. The switch 614 is for example controlled by phase signal φ2. Thus, while the current is discharged through the VCSEL 102, the capacitor 612 is charged to the highest voltage level present across the VCSEL 102, and when the signal φ2 is brought low, the differential amplifier 602 for example generates the level of the output voltage necessary to produce the voltage level VREF at the node 610 of the potential divider. The signal φ2 is for example brought low at the same time as the signal φ3 is asserted. In some embodiments, the voltage level VREF is between 1 and 3 V, the factor F is between 1 and 3, and the voltage VVAR is at between 1.5 and 5 V.

The voltage level VVAR can for example be controlled using the potential divider 604, 606 in order to adjust the voltage applied to the VCSEL 102, and thus the peak current passed through the VCSEL during the generation of the optical pulse. In some embodiments, the variable resistor 310 provides an additional means, under control of the control circuit 314, for regulating the current $i_1$ passed through the VCSEL 102 during the second phase. Alternatively, the variable resistor 310 may be omitted and replaced by a short to the ground rail or by a fixed resistor.

Figure 7:
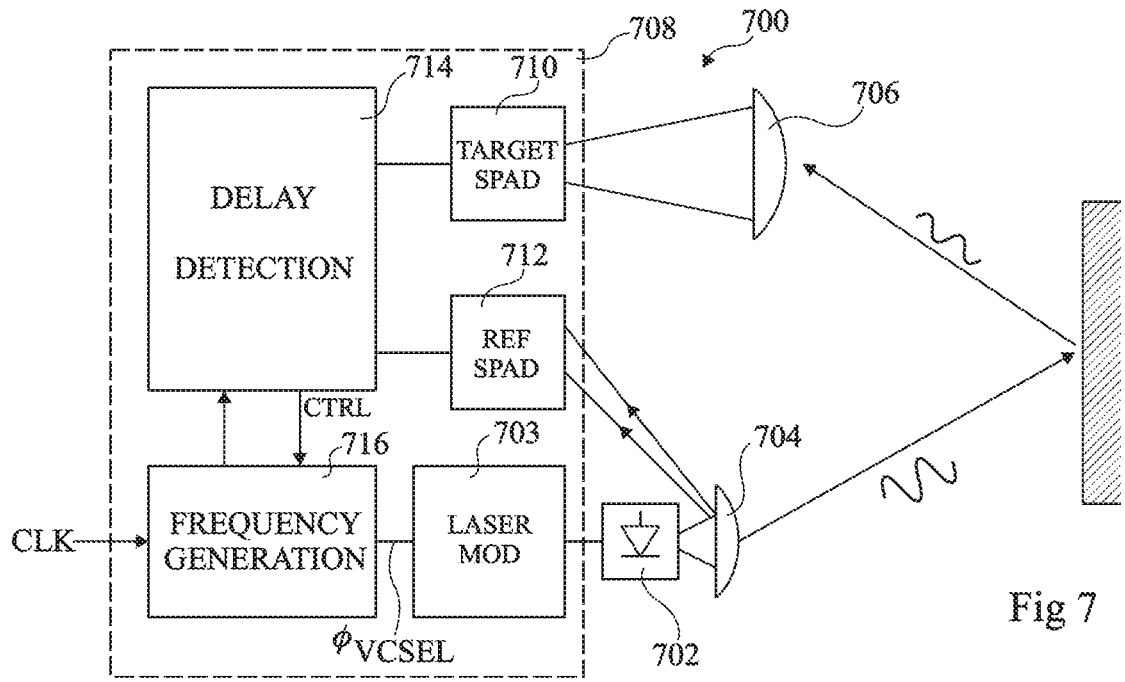
FIG. 7 schematically illustrates a ranging device according to an example embodiment.

FIG. 7 illustrates a ranging device 700 comprising a light emitting device 702, which is for example the VCSEL 102 described above, and a laser modulation circuit (LASER MOD) 703 for example implemented by the circuit 300, 500 or 600 described above for driving the VCSEL 102.

The light emitting device 702 for example transmits a laser beam into the image scene, for example via a lens 704. The return light pulses are for example received by a further lens 706 of the ranging device.

The ranging device 700 further comprises a detection circuit 708 for determining the distance between the device 700 and an object in the image scene, on which the light pulses reflect. The detection circuit 708 for example comprises a target SPAD array (TARGET SPAD) 710, which receives the return light pulses via the lens 706. The target SPAD array 710 for example comprises an array of between two and several hundred SPAD cells. In one example, the array is a 12×12 array comprising 144 SPADs.

The detection circuit 708 also for example comprises a reference SPAD array (REF SPAD) 712, which is for example of the same dimensions as the target SPAD array 710, and receives an internal reflection of the transmitted light pulses. A delay detection circuit (DELAY DETECTION) 714 is for example coupled to the target SPAD array 710 and to the reference SPAD array 712, and estimates the delay between each transmitted light pulse and the return light pulse received by the target SPAD array 710. The detection circuit 708 also for example comprises a frequency generation circuit (FREQUENCY GENERATION) 716, which generates a voltage signal $\phi_{VCSEL}$ provided to the laser modulation circuit 704 for generating the current driving the light emitting device 702. The delay detection circuit 714 for example provides a control signal CTRL to the frequency generation circuit 716 for controlling the period of the signal VCSEL.

An advantage of the embodiments described herein is that by driving a light emitting device by the discharge of a capacitor, a relatively high current can be achieved in a relatively short period. Furthermore, the level of the resulting current driven through the light emitting device can be relatively precise, especially if combined with a resistor, such as the variable resistor 310, coupled in series with the light emitting device. Furthermore, the circuit of FIG. 5 permits the voltage across the light emitting device 102 to be boosted to a level higher than the supply voltage VDD, and the circuit of FIG. 6 provides an additional regulation of the level of the voltage, leading to an even more precise current level.

Having thus described at least one illustrative embodiment, various alterations, modifications and improvements will readily occur to those skilled in the art. For example, it will be apparent to those skilled in the art that while the circuits in the various embodiments are coupled to a ground rail, more generally they could be coupled to a low voltage rail, which may be at the ground voltage, or a different low voltage such as a negative supply voltage.

Furthermore, the various features described in relation with the various embodiments could be combined, in alternative embodiments, in any combination. For example, the variable voltage level described in relation with FIG. 6 could be applied to the circuit of FIG. 3 without the switches 404 and 406.

The invention claimed is:

1. A method of optical pulse emission, comprising:
    during a first phase, charging a capacitor from a supply voltage node; and
    during a second phase, partially discharging the capacitor through a light emitting device to cause the optical pulse emission, and boosting a voltage stored on the capacitor to be greater than a supply voltage at the supply voltage node.

2. The method of claim 1, further comprising: during a third phase, further discharging the capacitor by bypassing the light emitting device.

3. The method of claim 2, wherein the third phase begins during the second phase such that the second phase and third phase partially overlap.

4. The method of claim 3, wherein the second phase begins immediately when the first phase ends.

5. The method of claim 1, further comprising regulating a voltage at the supply voltage node.

6. The method of claim 5, further comprising generating a feedback signal for said regulating during said second phase.

7. The method of claim 1, further comprising adjusting a variable resistance coupled in series with the light emitting device.

8. The method of claim 7, wherein, during the second phase, the capacitor is partially discharged through the light emitting device and variable resistance to ground.

9. The method of claim 1, wherein partially discharging the capacitor through the light emitting device emits an optical pulse into an image scene, said method further comprising detecting a return optical pulse from the image scene.

10. The method of claim 1, wherein, during the second phase, the capacitor is partially discharged through the light emitting device to ground.

11. The method of claim 1, wherein the optical pulse emission caused by the second phase is comprised of optical pulses having a period of less than 1 ns.

12. The method of claim 1, wherein the partial discharge of the capacitor through the light emitting device during the second phase occurs for no longer than 500 ps.

13. The method of claim 1, wherein the partial discharge of the capacitor through the light emitting device during the second phase occurs for between 250 ps to 2 ns.

14. The method of claim 1, wherein, during the second phase, the capacitor is partially discharged through the light emitting device and a fixed resistance to ground.

15. A method of optical pulse emission, comprising:
    during a first phase, closing a first switch to couple a first plate of a capacitor to a supply voltage node and closing a second switch to couple a second plate of the capacitor to ground;
    at an end of the first phase, opening the first and second switches;
    during a second phase, closing a third switch to couple the first plate of the capacitor to an anode of a light emitting device that has a cathode coupled to ground; and
    during a third phase, closing a fourth switch to couple the anode of the light emitting device to the cathode of the light emitting device.

16. The method of claim 15, further comprising, at an end of the second phase, opening the third switch.

17. The method of claim 16, wherein the end of the second phase occurs during the third phase.

18. The method of claim 17, wherein a start of the third phase occurs no more than 500 ps after a start of the second phase.

19. The method of claim 15, wherein, during the second phase, closing the third switch couples the first plate of the capacitor to the anode of the light emitting device such that the capacitor discharges through the light emitting device to ground.

20. The method of claim 15, wherein, during the second phase, closing the third switch couples the first plate of the capacitor to the anode of the light emitting device such that the capacitor discharges through the light emitting device and through an adjustable resistor to ground.

21. The method of claim 15, wherein, during the second phase, closing the third switch couples the first plate of the capacitor to the anode of the light emitting device such that the capacitor discharges through the light emitting device and through a fixed resistor to ground.

* * * * *